United States Patent [19]
Rugen

[11] Patent Number: 4,600,889
[45] Date of Patent: Jul. 15, 1986

[54] COHERENT OSCILLATOR

[75] Inventor: Thomas W. Rugen, Scottsdale, Ariz.

[73] Assignee: Motorola, Inc., Schaumburg, Ill.

[21] Appl. No.: 711,140

[22] Filed: Mar. 13, 1985

[51] Int. Cl.[4] .............................................. H03D 3/18
[52] U.S. Cl. ...................................... 329/50; 329/104;
329/122; 331/12; 331/14; 331/17; 331/25;
343/5 AF; 375/81; 375/94; 375/120
[58] Field of Search ....................... 331/11, 12, 14, 16,
331/17, 25; 343/5 AF; 329/50, 104, 107, 109,
122; 375/23, 24, 81, 94, 120; 455/214, 260, 265,
337

[56] References Cited
U.S. PATENT DOCUMENTS

| 4,063,188 | 12/1977 | Mawhinney | 331/11 |
| 4,095,224 | 6/1978 | Dounce et al. | 343/17.1 R |
| 4,101,844 | 7/1978 | Malone | 331/10 |
| 4,162,459 | 7/1979 | Schartman | 331/90 |
| 4,204,173 | 5/1980 | Aschwanden | 331/25 X |
| 4,389,594 | 6/1983 | Conciauro et al. | 315/39.55 |

Primary Examiner—Eugene R. LaRoche
Assistant Examiner—James C. Lee
Attorney, Agent, or Firm—Eugene A. Parsons

[57] ABSTRACT

A coherent oscillator circuit which samples a signal responsive to phase and frequency of a transmitted pulse of radio frequency energy in an acquisition mode, and regenerates a signal corresponding to the sampled phase and frequency in a save mode is disclosed. A storage element performs the sampling in a relative fast, open loop manner during the acquiring mode. Then, during the save mode a phase locked loop forms which locks when a loop oscillator outputs a signal which corresponds to the sampled signal. The coherent oscillator forms a portion of a demodulator for a coherent-on-receive radar.

20 Claims, 3 Drawing Figures

COHERENT OSCILLATOR

BACKGROUND OF THE INVENTION

This invention relates to a coherent oscillator which samples an input signal so that it can later regenerate the input signal's phase and frequency. More specifically, the present invention relates to demodulating reflected radar pulses utilizing a coherent oscillator. Furthermore, the present invention relates to coherent-on-receive radars which may find such a coherent oscillator particularly useful.

A radar transmits a short pulse of radio frequency energy and then receives a reflected portion of the energy during a pulse repetition interval. The reflected energy must be demodulated before information contained therein can be processed. Effective demodulation of the reflected energy often requires an oscillation signal which exhibits phase and frequency characteristics corresponding to those exhibited by the transmit pulse. However, at a time when such a signal is needed, the transmitter portion of a radar has ceased transmitting the transmit pulse and the transmit pulse is not available to aid generation of such a signal. Furthermore, a coherent-on-receive radar employs a noncoherent transmitter, such as a magnetron, which exhibits a random phase relationship from transmit pulse to succeeding transmit pulses. Thus, coherent-on-receive radars need a coherent oscillator which samples a transmit pulse as it is being transmitted and regenerates the phase and frequency of the transmit pulse as reflected energy is being received.

Coherent oscillators and demodulation techniques for coherent-on-receive radars are known in the prior art. One coherent oscillator technique utilizes a relatively conventional phase locked loop circuit which locks onto a phase and frequency representative of a transmit pulse and then holds the phase and frequency during the pulse repetition interval. However, a loop filter portion of a phase locked loop which might permit locking within the time interval of a transmit pulse would not permit holding of the sampled signal for an adequately long pulse repetition interval. Conversely, a loop filter which permits the phase locked loop to remain in lock during the pulse repetition interval does not permit the phase locked loop to achieve a locked condition within a relatively short time period of the transmit pulse. Thus, this phase locked loop coherent oscillator requires the radar to utilize undesirably long transmit pulse intervals and undesirably short pulse repetition intervals.

One relatively unconventional prior art phase locked loop circuit permits an oscillator portion of the phase locked loop to exhibit a phase and frequency characteristic of the inlock condition longer than would otherwise be permitted by the loop filter. U.S. Pat. No. 4,101,844 issued to Hugh Robert Malone describes this phase locked loop. The Malone circuit achieves a locked condition in a closed loop mode while a signal is being received. In this closed loop mode a sample and hold amplifier acquires and outputs a voltage level representative of a signal which controls operation of a VCO portion of the circuit. Then, the received signal disappears and the circuit switches to an open loop mode where the VCO is controlled by the voltage level acquired and output by the sample and hold amplifier. While this phase locked loop circuit is suitable for its intended purpose as a system oscillator for transponders, it is inoperative in radar applications where short transmit pulse intervals do not permit the locking of a phase locked loop.

Additionally, digital techniques have been employed in the demodulation of coherent-on-receive radar signals, as described in U.S. Pat. No. 4,095,224 issued to Eric A. Dounce and Guy V. Morris. Although these digital techniques are effective in a variety of radar applications, they are undesirably complex, costly and troublesome.

SUMMARY OF THE INVENTION

Accordingly, it is an object of the present invention to provide an improved coherent oscillator circuit which rapidly acquires a sampled input signal and retains the signal for a relatively long period of time.

Another object of the present invention concerns providing an improved demodulator circuit which utilizes a coherent oscillator and may be useful in coherent-on-receive radar applications.

Yet another object of the present invention concerns providing an improved coherent oscillator which exhibits a phase locked loop's locking characteristic but permits rapid acquisition of an input signal and remains in lock for a relatively long period of time after the input signal disappears.

The above and other objects and advantages of the present invention are carried out in one form by a circuit which includes a switch, a reference oscillator, a phase detector, a storage element, a subtractor, and a variable frequency oscillator. The switch receives an input master signal at a first signal input and has an output which connects to an input of the phase detector. The reference oscillator has an output which connects to another input of the phase detector, and the phase detector has an output which connects to an input of the storage element. The output of the phase detector also connects to one input of a subtractor and an output of the storage element connects to another subtractor input. An output of the subtractor connects to a control input of the variable frequency oscillator, and an output of the variable frequency oscillator connects to a second input of the switch. The variable frequency oscillator's output provides a coherent oscillator output signal.

BRIEF DESCRIPTION OF THE DRAWINGS

A more complete understanding of the present invention may be derived by reference to the detailed description and claims when considered in conjunction with the accompanying drawings, wherein:

DETAILED DESCRIPTION OF THE PREFERRED EMBODIMENTS

Figure 1:
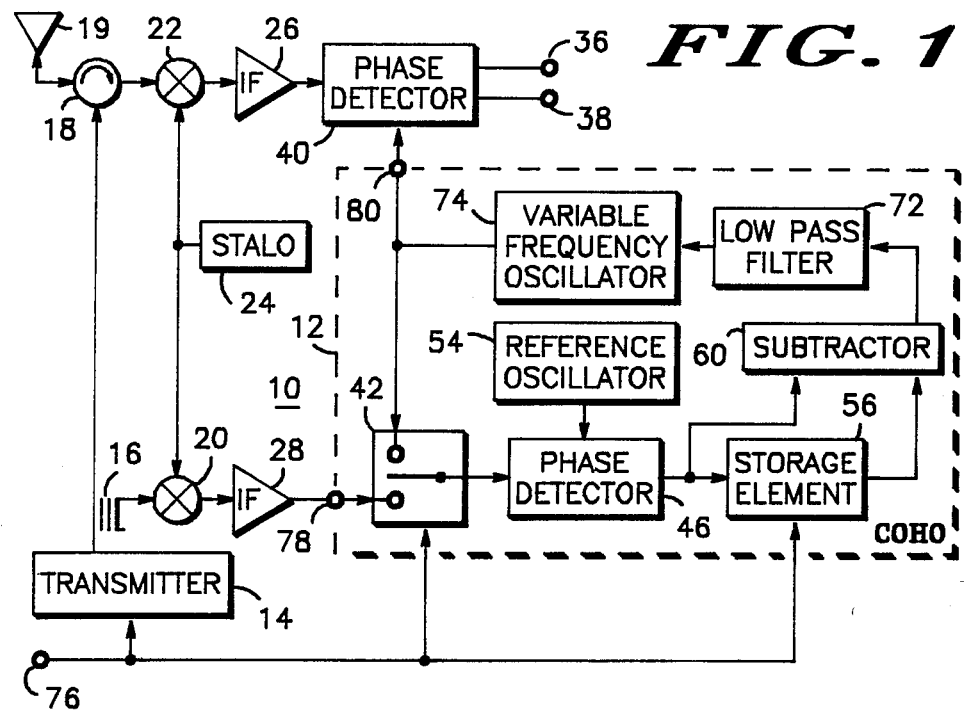
FIG. 1 shows a block diagram of a demodulator which employs a coherent oscillator.

Referring to FIG. 1, a demodulator 10 includes an antenna 19 connected to a first port of a circulator 18. As is conventional in the radar arts, antenna 19 both transmits and receives radio frequency signals and circulator 18 serves as a duplexer to separate transmitted and received radio frequency signals.

A transmitter 14 has an output which connects to a second port of circulator 18. An input of transmitter 14 connects to pulse control terminal 76. Transmitter 14 produces a pulse, or burst, of radio frequency energy in response to a pulse control signal input at terminal 76. Furthermore, transmitter 14 may be a non-coherent transmitter, such as a magnetron. Such a non-coherent transmitter may transmit at a relatively constant frequency from transmit pulse to transmit pulse, but may produce pulses which exhibit a random phase relationship.

A coupler 16 diverts a small portion of the RF energy produced by a transmitter 14 and supplies this energy to a first input of a mixer 20. Coupler 16 is located between transmitter 14 and circulator 18.

A third port of circulator 18 connects to a first input of a mixer 22. This third port of circulator 18 routes the received radio frequency signal from antenna 19 to mixer 22.

A stable local oscillator (STALO) 24 has an output which connects to a second input of mixer 20 and to a second input of mixer 22. STALO 24 provides a free running oscillator reference signal to mixers 20 and 22. Mixer 22 has an output which connects to an input of IF amplifier 26. Likewise, mixer 20 has an output which connects to an input of IF amplifier 28. Since mixers 20 and 22 utilize the same signal, namely the reference signal generated by STALO 24, to down-convert the transmitted and received signals, intermediate frequency output signals result which exhibit the same phase and frequency relationships as are exhibited between the transmitted and received signals.

An output of IF amplifier 28 connects to coherent oscillator (COHO) 12 at a node 78. An output of COHO 12 at node 80 connects to a first input of phase detector 40, and an output of IF amplifier 26 connects to a second input of phase detector 40. In the FIG. 1 embodiment, phase detector 40 represents a quadrature phase detector which supplies an in-phase demodulated output signal at an output which connects to terminal 36 and supplies a quadrature demodulated output signal at an output which connects to terminal 38.

Coherent oscillator (COHO) 12 is shown in FIG. 1 as including a loop switch 42 which has first and second signal inputs, a control input, and an output. The control input of loop switch 42 connects to pulse control terminal 76. The first signal input of loop switch 42 connects to node 78, which supplies a master signal from IF amplifier 28. The output from loop switch 42 connects to a first input of a phase detector 46. A reference oscillator 54 provides a reference signal at an output of reference oscillator 54, and this output connects to a second input of phase detector 46. Phase detector 46 has an output which connects to a signal input of storage element 56 and a first input of a subtractor 60. An output of storage element 56 connects to a second input of subtractor 60, and a control input of storage element 56 connects to pulse control terminal 76. An output of subtractor 60 connects to an input of low pass filter 72, and an output of low pass filter 72 connects to a control input of variable frequency oscillator 74. Variable frequency oscillator 74 has an output which connects to node 80 and the second input of loop switch 42. The output of variable frequency oscillator 74 supplies a coherent oscillator output signal.

Coherent oscillator (COHO) 12 operates in two modes. An "acquisition" mode occurs when transmitter 14 transmits a pulse of radio frequency energy. In the acquisition mode an intermediate frequency master signal corresponding to the transmitted pulse of radio frequency energy is supplied to loop switch 42 from node 78. Under control of the pulse control signal supplied at pulse control terminal 76, loop switch 42 connects the master signal to the output of loop switch 42 and therefore to the first input of phase detector 46.

Reference oscillator 54 provides a free running reference signal at a frequency which approximates the frequency of the master signal. Reference oscillator 54 may be synchronized with STALO 24 but exhibits a frequency which is lower than the frequency of the signal output from STALO 24.

Phase detector 46 provides at its output a relatively constant DC voltage level for the duration of the transmitted pulse. This voltage level output is responsive to the difference in phase between the reference signal output from reference oscillator 54, and the master signal.

Further, during the acquisition mode, storage element 56 samples, or acquires, the signal output by phase detector 46. A sampled phase signal, which storage element 56 provides, exhibits a value approximately equal to the value of the signal sampled at the signal input of storage element 56. During the acquisition mode, the coherent oscillator output signal which is output from variable frequency oscillator 74, may be driven to exhibit a frequency and phase close to that exhibited by the master signal, but may not yet precisely duplicate the master signal's phase and frequency.

When transmitter 14 ceases to produce the RF pulse, coherent oscillator 12 operates in a "save" mode. In the save mode loop switch 42 connects its second signal input to its output. Storage element 56 saves, or holds, the signal previously sampled during the acquisition mode. Loop switch 42 and storage element 56 operationally differentiate between the save and acquisition modes under control of the pulse control signal applied at pulse control terminal 76.

In the save mode phase detector 46 generates a signal which indicates the phase difference between the reference signal output from reference oscillator 54 and the coherent oscillator output signal generated by variable frequency oscillator 74. This phase difference is presented to one input of subtractor 60. The other input of subtractor 60 receives a phase difference value from storage element 56 representative of the phase difference between the reference signal and the master signal acquired during the prior acquisition mode described above. Subtractor 60 provides an error signal which controls the frequency of the coherent oscillator signal generated by variable frequency oscillator 74. Resultingly, coherent oscillator (COHO) 12 operates as a phase locked loop in the save mode. Low pass filter 72 operates as the phase locked loop's loop filter. COHO 12 outputs a frequency and phase that causes the error signal output from subtractor 60 to exhibit a value of zero. Subtractor 60 calculates the difference between phase relationships of the previously save master signal and a current coherent oscillator output signal. Thus, the coherent oscillator output signal regenerates the master signal's phase and frequency when the output from subtractor 60 exhibits a value of zero.

In summary, storage element 56 saves a phase difference value which corresponds to the phase and frequency differences of a transmitted RF signal relative to the frequencies exhibited by reference oscillator 54 and STALO 24. After the transmitted RF pulse disappears, a phase locked loop forms causing variable frequency oscillator 74 to generate a coherent oscillator output signal which regenerates an equivalent phase difference value as was saved in storage element 56. Furthermore, the phase locked loop which forms during the save mode is not required to achieve a locked condition during the period when transmitter 14 produces the transmitted radio frequency signal. In fact, the phase locked loop does not even form until after the master signal disappears.

A consequence of the phase locked loop not forming until after the transmit pulse and master signal disappears is that the coherent oscillator output signal precisely regenerates the master signal only after a predetermined time interval transpires following entry of the save mode. Accordingly, the signals appearing at terminals 36 and 38 may be improperly demodulated within this predetermined time interval. This predetermined time interval is short relative to a radar's pulse repetition interval and occurs only while the radar receives reflected energy from close objects. Thus, it is believed that no severe limitation is presented to most radar applications.

Figure 2:
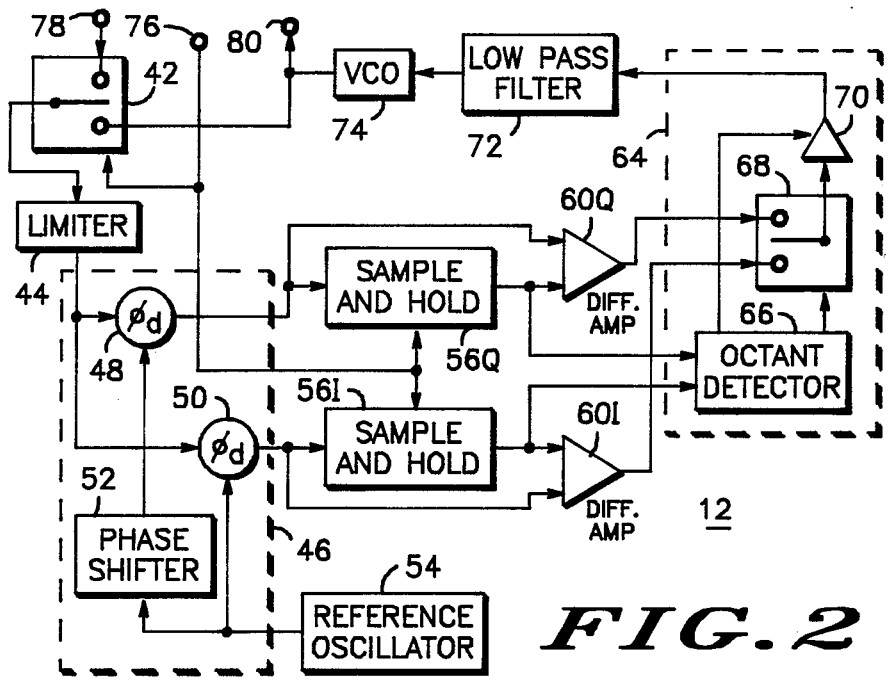
FIG. 2 shows a more detailed block diagram of a coherent oscillator.

The present invention encompasses both analog and digital implementations of coherent oscillator (COHO) 12. A particular analog embodiment is shown in FIG. 2, wherein master signal node 78 connects to the first signal input of loop switch 42, and control pulse terminal 76 connects to the control input of loop switch 42. The output of loop switch 42 connects to an input of a limiter 44, and an output of limiter 44 connects to the first input of phase detector 46. The output of reference oscillator 54 connects to the second input of phase detector 46.

In this embodiment phase detector 46 represents a quadrature phase detector having an in-phase, phase detector 50, a shifted-phase, phase detector 48, and a phase shifter 52. The output of limiter 44 connects to first inputs of phase detectors 48 and 50, and the output of reference oscillator 54 connects to an input of phase shifter 52 and a second input of in-phase, phase detector 50. An output of phase shifter 52 connects to a second input of shifted-phase, phase detector 48. An output of shifted-phase, phase detector 48 provides a quadrature phase signal and connects to an input of a sample and hold amplifier 56Q and an input of a differential amplifier 60Q. Likewise, an output of in-phase, phase detector 50 connects to an input of a sample and hold amplifier 56I and to an input of a differential amplifier 60I. Pulse control terminal 76 connects to control inputs of sample and hold amplifiers 56Q and 56I.

An output of sample and hold amplifier 56Q connects to a second input of differential amplifier 60Q and to a first input of an octant detector 66. An output of sample and hold amplifier 56I connects to a second input of differential amplifier 60I and to a second input of octant detector 66. An output from differential amplifier 60Q connects to a first signal input of gain controller switch 68, and an output of differential amplifier 60I connects to a second signal input of gain controller switch 68. A first output from octant detector 66 connects to a control input of gain controller switch 68 and a second output of octant detector 66 connects to a control input of a selective inverter 70. An output of gain controller switch 68 connects to a signal input of selective inverter 70. Selective inverter 70 may be implemented using a multiplier. An output of selective inverter 70 connects to the input of low pass filter 72, and the output of low pass filter 72 connects to the input of voltage controlled oscillator (VCO) 74. The output from VCO 74 connects to the second signal input of loop switch 42 and to node 80, and provides the coherent oscillator output signal as described above in connection with FIG. 1.

Between FIGS. 1 and 2, similar reference numbers describe similar items. Thus, quadrature phase detector 46 shown in FIG. 2 represents one specific implementation of phase detector 46 shown in FIG. 1. Likewise, sample and hold amplifiers 56Q and 56I (see FIG. 2) represent particular analog implementations of storage element 56 (see FIG. 1). Additionally, differential amplifiers 60Q and 60I (see FIG. 2) represent particular analog implementations of subtractor 60 (see FIG. 1) and VCO 74 (see FIG. 2) represents one particular implementation of variable frequency oscillator 74 (see FIG. 1).

The FIG. 2 embodiment of coherent oscillator (COHO) 12 contains three additional aspects which were not shown or described above in connection with the FIG. 1 embodiment of COHO 12. First, the FIG. 2 embodiment contain limiter 44 coupled between loop switch 42 and phase detector 46. Limiters are well known in the art to condition signals so that signals presented at the output thereof exhibit a predetermined amplitude range. In this particular embodiment limiter 44 insures that signals presented to phase detector 46 are of the same amplitude and within operational limits of phase detector 46.

Figure 3:
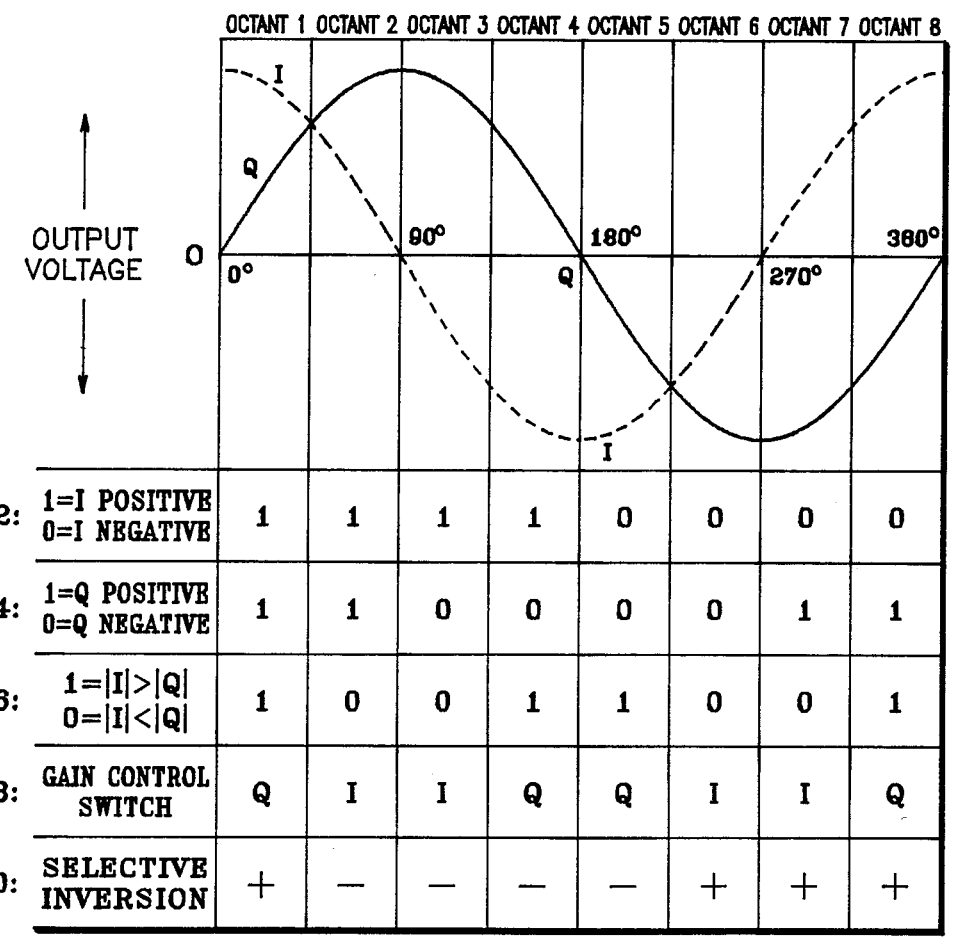
FIG. 3 shows a logical diagram which defines the operation of a gain controller portion of the coherent oscillator shown in FIG. 2.

A second additional aspect of the FIG. 2 embodiment of COHO 12 concerns the use of a quadrature phase detector for phase detector 46. Quadrature phase detectors provide in-phase and quadrature output signals. The inphase signal represents the phase difference between the reference signal and the input signal, and the quadrature signal represents the phase different between the input signal and the reference signal shifted by 90°. The quadrature signal represents a sine function of the phase difference between the reference signal and the input signal while the quadrature signal represents a cosine function of the phase difference between the reference signal and the input signal. The I & Q traces shown in FIG. 3 illustrate the in-phase and quadrature signals, respectively, and their relationship. These two signals which are provided by a quadrature phase detector provide information which permits an unambiguous determination of the phase angle between the input signal and the reference signal. Since two output signals are provided by quadrature phase detector 46, two sample and hold amplifiers and two differential amplifiers are used to process the two output signals.

A third additional aspect of the FIG. 2 embodiment of COHO 12 concerns a gain controller 64 section of COHO 12. Gain controller 64 represents the section of COHO 12 which encompasses octant detector 66, gain controller switch 68, and selective inverter 70.

As discussed above, the output from difference amplifiers 60 in the save mode represents the difference between the saved phase relationship of a prior occurring master signal and the phase relationship of a current coherent oscillator output signal. Each output from difference amplifiers 60I and 60Q represents an error signal which is responsive to the difference between these two phase relationships. Gain controller 64 selects one of the two error signals output from difference amplifiers 60Q and 60I to control the frequency of the signal generated by VCO 74. Octant detector 66 processes the sampled phase signals output from sample and hold amplifiers 56Q and 56I to determine which 45° interval, or octant, of phase difference between the reference signal and the input signal is indicated by the saved in-phase and quadrature phase signals. The particular indicated octant specifies which of the two error signals to select for controlling VCO 74. Furthermore, gain controller 64 may selectively invert whichever of the two error signals has been selected. The decision of whether to invert the selected error signal is also based on the indicated octant. FIG. 3 presents a table which defines the signal selection and inversion processes that occur within gain controller 64.

Gain controller 64 permits operation of COHO 12 over a full 360° of phase difference between input signals and the reference signal. Since sine and cosine functions represent the outputs from phase detector 46, within four of the eight octants increasing phase changes of the input signal with respect to the reference signal produce increasing voltage output levels. In other words, each of the quadrature and inphase output signals from phase detector 46 exhibits a positive slope over only a particular four fo the eight octants. Conversely, in the other four of eight octants, each of the in-phase and quadrature output signals from phase detector 46 exhibits a negative polarity slope.

As discussed above, when COHO 12 enters the save mode a phase locked loop circuit forms. The polarity of the slope of the signals generated by phase detector 46 influences the loop gain of this phase locked loop. Accordingly, the selected error signal which drives low pass filter 72 must exhibit a constant polarity slope in order for the phase locked loop to properly operate. This allows VCO 14 to change the frequency of its output signal in a manner which consistently causes the error signal to approach a zero voltage level.

Referring to FIG. 3, the I & Q signals represent the in-phase and quadrature phase difference signals output from phase detector 46 and saved in sample and hold amplifiers 56Q and 56I. Octant detector 66 monitors the polarity and absolute value of the voltage levels exhibited by these I & Q signals. As shown in FIG. 3, a code which uniquely identifies each octant results.

One possible coding scheme is described in the relationship between variables 82, 84, and 86, as shown in FIG. 3. Thus, during octant 1, which represents a phase difference of 0° to 45° between the reference signal and the input signal, a unique code is presented in variables 82, 84, and 86. Both the I signal and the Q signal are positive, and the absolute value of the I signal is greater than the absolute value of the Q signal. Accordingly, during octant 1, octant detector 66 controls gain controller switch 68 so that the error signal output from difference amplifier 60Q is presented to low pass filter 72, as indicated in row 88. Furthermore, during octant 1 selective inverter 70 does not invert this error signal, as indicated in row 90. In a similar manner, during octant 2 gain controller switch 68 selects the error signal output from difference amplifier 60I and selective inverter 70 inverts this error signal before presenting it to low pass filter 72. In octant 3 the error signal output from differential amplifier 60I is selected and inverted. In octants 4 and 5 the error signal output from differential amplifier 60Q is selected and inverted. In octants 6 and 7 the error signal output from differential amplifier 60I is selected and not inverted. Finally, in octant 8 the error signal output from differential amplifier 60Q is selected but not inverted.

The selection and inversion process minimizes transient effects which might be caused by switching when phase difference signals cross boundary lines between octants. In the switching process outlined above, all switching occurs when the absolute value of the inphase and quadrature phase signals are approximately equal. Thus, the response of phase detector 46 to frequency changes in the signal output from VCO 74 which occur at these boundaries causes approximately equal changes in the in-phase and quadrature output signals. Accordingly, at the boundaries where switching between quadrature and in-phase signals occur, similar authority over VCO 74 exists regardless of which phase difference signal is selected. Additionally, low pass filter 72 blocks the passage of relatively higher frequency transient effects.

The foregoing description uses preferred embodiments to illustrate the present invention. However, those skilled in the art will recognize that various changes and modifications may be made in these embodiments without departing from the scope of the present invention. For example, a digital implementation of COHO 12 is intended to be included within the scope of the present invention.

In a digital implementation of COHO 12, phase detector 46 may produce a digital output, and storage element 56 may represent a latch or latches. Additionally, subtractor 60 may represent any arithmetic unit which can produce a difference between two digital signals. Octant detector 66 may likewise incorporate various digital logic gates to accomplish the selection process shown in FIG. 3. Switch 68 may utilize a multiplexer and selective inverter 70 may incorporate Exclusive-OR elements. Further, low pass filter 72 may be implemented digitally and variable frequency oscillator 74 may represent a numerically controlled oscillator. These and other modifications obvious to those skilled in the art are intended to be included within the scope of this invention.

What is claimed is:

1. A coherent oscillator circuit for regenerating the phase and frequency of a master signal in a coherent oscillator output signal, said circuit comprising:
   a switch having a first signal input adapted to receive the master signal, a second signal input, and an output;
   a reference oscillator having an output for providing a reference signal;
   a phase detector having a first input coupled to the output of said switch, a second input coupled to the output of said reference oscillator, and an output;
   a storage element having a signal input coupled to the output of said phase detector and an output for providing a sampled phase signal;
   a subtractor having a first input coupled to the output of said phase detector, a second input coupled to the output of said storage element, and having an output; and
   a variable frequency oscillator having a control input coupled to the output of said subtractor and an output coupled to the second signal input of said switch, the output of said variable frequency oscillator being for supplying the coherent oscillator output signal.

2. A coherent oscillator circuit as claimed in claim 1 wherein:
   said switch additionally comprises a control input for controlling the operation of said switch, said switch control input being configured so that said switch connects the first signal input to the output of said switch in a first mode and the second signal input to the output of said switch in a second mode; and said storage element additionally comprises a control input for controlling the operation of said storage element, said storage element control input being configured so that said storage element samples during the first mode and saves during the second mode.

3. A coherent oscillator circuit as claimed in claim 1 additionally comprising a low pass filter having an input coupled to the output of said subtractor and an output coupled to the control input of said variable frequency oscillator.

4. A coherent oscillator circuit as claimed in claim 1 wherein said storage element comprises a sample and hold amplifier.

5. A coherent oscillator circuit as claimed in claim 1 wherein said subtractor comprises a differential amplifier.

6. A coherent oscillator circuit as claimed in claim 1 additionally comprising:
- a phase shifter having an input coupled to the output of said reference oscillator and having an output, said phase shifter being for providing a second reference signal which exhibits a frequency approximately equal to a frequency exhibited by the reference signal and a phase shifted approximately 90° from a phase exhibited by the reference signal;
- a second phase detector having a first input coupled to the output of said switch, a second input coupled to the output of said phase shifter, and an output;
- a second storage element having a signal input coupled to the output of said second phase detector and an output for providing a second sampled phase signal; and
- a second subtractor having a first input coupled to the output of said second phase detector, a second input coupled to the output of said second storage element, and having an output coupled to said variable frequency oscillator.

7. A coherent oscillator circuit as claimed in claim 6 additionally comprising a gain controller having first and second inputs coupled to the outputs of said storage and second storage elements, respectively, third and fourth inputs coupled to the ouputs of said subtractor and second subtractor, respectively, and an output coupled to the control input of said variable frequency oscillator.

8. A coherent oscillator circuit as claimed in claim 7 wherein said gain controller comprises a second switch having a first signal input coupled to the output of said subtractor, a second signal input coupled to the output of said second subtractor, and an output coupled to the input of said variable frequency oscillator, said second switch being for providing an error signal to said variable frequency oscillator.

9. A coherent oscillator circuit as claimed in claim 8 wherein said gain controller additionally comprises an octant detector having a first input coupled to the output of said storage element, a second input coupled to the output of said second storage element, and an output coupled to said second switch, said octant detector being for controlling the operation of said second switch in response to the sampled phase and second sampled phase signals.

10. A coherent oscillator circuit as claimed in claim 9 wherein said gain controller additionally comprises a selective inverter having first and second inputs and an output for conditioning the error signal wherein:
- the first input of said selective inverter couples to the output of said second switch;
- the output of said selective inverter couples to the input of said variable frequency oscillator; and
- said octant detector additionally comprises a second output coupled to the second input of said selective inverter, said octant detector second output being for controlling the operation of said selective inverter so that a slope of the error signal exhibits a constant polarity.

11. A method of regenerating phase and frequency characteristics of a master signal pulse, the method comprising the steps of:
- generating a signal responsive to a first phase difference between the master signal pulse and a reference oscillation signal;
- saving the signal of said generating step to produce a saved phase difference;
- controlling the frequency of a variable frequency oscillator signal with an error signal output from a subtractor;
- detecting a second phase difference between the variable frequency oscillator signal and the reference oscillation signal; and
- calculating the difference between the saved phase difference and the second phase difference in the subtractor.

12. A method as claimed in claim 11 wherein:
- said generating and detecting steps each produce in-phase and quadrature phase signals;
- said saving step produces in-phase and quadrature saved phase differences;
- said calculating step calculates an in-phase difference between the in-phase saved phase difference and the in-phase second phase difference, and said calculating step calculates a quadrature difference between the quadrature saved phase difference and the quadrature second phase difference; and
- the method additionally comprises the step of selecting one of said in-phase and quadrature differences to control the frequency in said controlling step.

13. A method as claimed in claim 12 additionally comprising the step of selectively inverting the difference selected in said selecting step in response to the in-phase and quadrature phase differences saved in said saving step.

14. A coherent demodulator circuit for providing a demodulated signal, said circuit comprising:
- a local oscillator having an output for providing a first reference signal;
- a first mixer having a first input adapted to receive a transmitted radio frequency signal, a second input coupled to the output of said local oscillator, and an output;
- a second mixer having a first input adapted to receive a received radio frequency signal, a second input coupled to the output of said local oscillator, and an output;
- a first switch having a first signal input coupled to the output of said first mixer, a second signal input, and an output;
- a first phase detector having a first input coupled to the output of said first switch, a second input adapted to receive a second reference signal, and an output;

a first storage element having a signal input coupled to the output of said first phase detector and an output for providing a first sampled phase signal;

a first subtractor having a first input coupled to the output of said phase detector, a second input coupled to the output of said first storage element, and having an output;

a variable frequency oscillator having a control input coupled to the output of said first subtractor and an output coupled to the second signal input of said first switch;

a second phase detector having a first input coupled to the output of said second mixer, a second input coupled to the output of said variable frequency oscillator, and an output for providing the demodulated signal.

15. A coherent demodulator circuit as claimed in claim 14 wherein:

said first switch additionally comprises a control input for controlling the operation of said first switch, said first switch control input being configured so that said first switch connects the first signal input to the output of said first switch in a first mode and the second signal input to the output of said first switch in a second mode;

said first storage element additionally comprises a control input for controlling the operation of said first storage element, said first storage element control input being configured so that said first storage element samples during the first mode and saves during the second mode.

16. A coherent demodulator circuit as claimed in claim 14 wherein said first phase detector represents a quadrature phase detector having first and second outputs, the first output of said first phase detector being coupled to the input of said first storage element, the demodulator additionally comprising:

a second storage element having a signal input coupled to the second output of said first phase detector and an output for providing a second sampled phase signal; and a second subtractor having a first input coupled to the second output of said first phase detector, a second input coupled to the output of said second storage element, and having an output coupled to said variable frequency oscillator.

17. A coherent demodulator circuit as claimed in claim 14 additionally comprising a gain controller having first and second inputs coupled to the outputs of said first and second storage elements, respectively, third and fourth inputs coupled to the outputs of said first and second subtractors, respectively, and an output coupled to the control input of said variable frequency oscillator.

18. A coherent demodulator circuit as claimed in claim 17 wherein said gain controller comprises a second switch having a first signal input coupled to the output of said first subtractor, a second signal input coupled to the output of said second subtractor, and an output coupled to the input of said variable frequency oscillator, said second switch being for providing an error signal to said variable frequency oscillator.

19. A coherent demodulator circuit as claimed in claim 18 wherein said gain controller additionally comprises an octant detector having first and second inputs coupled to the outputs of said first and second storage elements, respectively, and an output coupled to said second switch, said octant detector being for controlling the operation of said second switch in response to the first and second sampled phase signals.

20. A coherent demodulator circuit as claimed in claim 19 wherein said gain controller additionally comprises a selective inverter having first and second inputs and an output for conditioning the error signal so that a slope of a second error signal at the output of said selective inverter exhibits a constant polarity, and wherein:

the first input of said selective inverter couples to the output of said second switch;

the output of said selective inverter couples to the input of said variable frequency oscillator; and said octant detector additionally comprises a second output coupled to the second input of said selective inverter.

* * * * *